(12) United States Patent
Warntjes

(10) Patent No.: US 7,242,192 B2
(45) Date of Patent: Jul. 10, 2007

(54) RF SURFACE COIL FOR USE IN MRI WITH REDUCE SENSITIVITY CLOSE TO THE CONDUCTORS

(75) Inventor: Jan Bertus Marten Warntjes, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 1 day.

(21) Appl. No.: 10/555,937

(22) PCT Filed: May 5, 2004

(86) PCT No.: PCT/IB2004/050596

§ 371 (c)(1),
(2), (4) Date: Nov. 8, 2005

(87) PCT Pub. No.: WO2004/099806

PCT Pub. Date: Nov. 18, 2004

(65) Prior Publication Data

US 2007/0030003 A1 Feb. 8, 2007

(30) Foreign Application Priority Data

May 8, 2003 (EP) .................................. 03101271

(51) Int. Cl.
*G01V 3/00* (2006.01)

(52) U.S. Cl. ..................................................... 324/318

(58) Field of Classification Search ................ 324/307, 324/309, 318, 322
See application file for complete search history.

(56) References Cited

U.S. PATENT DOCUMENTS 3,025,456 A * 3/1962 Codrington .................. 324/314
4,816,765 A   3/1989 Boskamp ..................... 324/318

(Continued)

FOREIGN PATENT DOCUMENTS

EP        0 364 061 A2    4/1990

EP        1 037 068 A2    9/2000

OTHER PUBLICATIONS

Rath, A.R., et al.; A Spatially Selective Opoposed-Loop Surface Coil; 1988; J. Mag. Reson.; 79:461-473.

(Continued)

*Primary Examiner*—Brij Shrivastav
*Assistant Examiner*—Dixomara Vargas
(74) *Attorney, Agent, or Firm*—Thomas M. Lundin

(57) ABSTRACT

The invention relates to a radio-frequent (RF) coil system (17, 17') for use in a magnetic resonance imaging (MRI) system. The RF coil system comprises at least one main coil (35) for transmitting an RF magnetic field (B1) into and/or receiving an RF magnetic field (B1') from an examination volume (3) of the MRI system. The main coil has a coil axis (36), which is or is to be oriented parallel to a main magnetic field (Bo) in the examination volume (3), and at least one electrical conductor (37, 39) which extends mainly parallel to the coil axis. According to the invention, the RF coil system comprises an auxiliary coil (45, 47) which is assigned to said conductor of the main coil. The auxiliary coil has two electrical conductors (49, 51) which extend mainly parallel to the coil axis and on opposite sides of said conductor of the main coil. A distance between the two conductors of the auxiliary coil and the conductor of the main coil is small relative to a main dimension (L) of the main coil. In transmission mode, RF signals are supplied to the main coil and to the auxiliary coil with such a mutual phase difference, that a combined RF magnetic field (Bc) of the main coil and the auxiliary coil has a direction of rotation (RB) opposite to a direction of precession (Rp) of the spin axes of the spinning nuclei in a body to be examined. In receiving mode, a first RF signal received by the main coil and a second RF signal received by the auxiliary coil are combined and added at such a mutual phase difference, that the second RF signal suppresses the first RF signal. In this manner, the disadvantageous high local sensitivity of the RF coil system for the local region (38, 40) adjoining said conductor of the main coil is strongly reduced.

9 Claims, 3 Drawing Sheets

Figure 1:
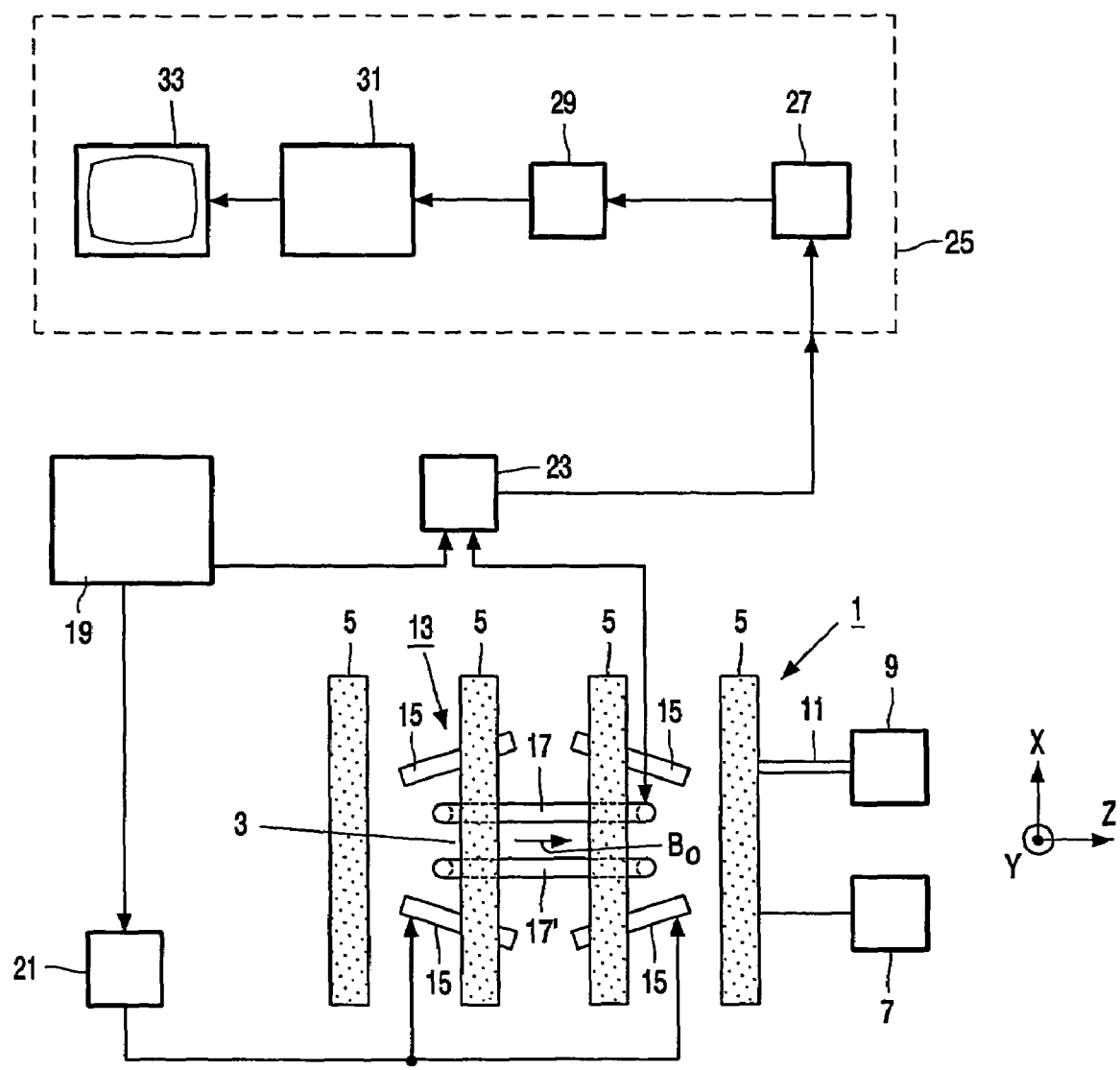

U.S. PATENT DOCUMENTS 5,602,556 A * 2/1997 Bowers ...................... 343/742
6,297,636 B1 * 10/2001 Shimo et al. ............... 324/318
6,366,092 B1 * 4/2002 Ehnholm et al. ........... 324/309
6,404,201 B1 6/2002 Boskamp .................... 324/318
6,437,567 B1 * 8/2002 Schenck et al. ............ 324/318

OTHER PUBLICATIONS

Burl, M., et al.; Examples of the Design of Screened and Shielded RF Receiver Coils; 1996; MRM, 36:326-330.

* cited by examiner

RF SURFACE COIL FOR USE IN MRI WITH REDUCE SENSITIVITY CLOSE TO THE CONDUCTORS

The invention relates to a radio-frequent (RF) coil system for use in a magnetic resonance imaging (MRI) system, comprising at least one electrical main coil for transmitting an RF magnetic field into an examination volume of the MRI system for generating nuclear spin resonance effects with a predetermined direction of precession, said main coil having a coil axis which is to be oriented substantially parallel to a main magnetic field of the MRI system in the examination volume, said main coil having at least one electrical conductor extending mainly parallel to the coil axis.

The invention further relates to a radio-frequent (RF) coil system for use in a magnetic resonance imaging (MRI) system, comprising at least one electrical main coil for receiving an RF magnetic field in an examination volume of the MRI system generated as a result of nuclear spin resonance effects, said main coil having a coil axis which is to be oriented substantially parallel to a main magnetic field of the MRI system in the examination volume, said main coil having at least one electrical conductor extending mainly parallel to the coil axis.

The invention further relates to a magnetic resonance imaging (MRI) system comprising an examination volume, a main magnet system for generating a main magnetic field in the examination volume, a gradient magnet system for generating gradients of the main magnetic field, and an RF coil system for transmitting and/or receiving an RF magnetic field in the examination volume.

Radio-frequent (RF) coil systems and a magnetic resonance imaging system of the kind mentioned in the opening paragraphs are generally known. The known MRI system is used to make images of the entrails of a patient's body by means of a nuclear spin resonance method. The main magnet system of the MRI system comprises a number of superconducting electrical coils for generating a relatively strong and uniform main magnetic field within a central region of the examination volume. The gradient magnet system comprises a number of electrical coils for generating gradients of the main magnetic field in three orthogonal directions. The known MRI system further comprises a first RF coil system for transmitting an RF magnetic field into the examination volume and a second RF coil system for receiving an RF magnetic field from the examination volume. It is also known to use a single RF coil system for transmission and receiving purposes. An image of the patient's body is constructed by successively observing nuclear spin resonance effects in a large number of positions in the patient's body, which are successively selected by altering said gradients. For each selected position, the first RF coil system transmits an RF magnetic field into the examination volume in order to generate nuclear spin resonance effects in the selected position. Subsequently, the second RF coil system receives an RF magnetic field which is generated in the selected position as a result of the nuclear spin resonance effect. Preferably, the first RF coil system generates a rotating RF magnetic field having a direction of rotation corresponding to a predetermined direction of precession of the nuclear spins. In this manner, the sensitivity of the RF coil system is improved.

A disadvantage of the known RF coil systems and of the known MRI system comprising the known RF coil systems is that the RF coil systems have a relatively high local sensitivity for regions of the patient's body which are relatively close to the individual electrical conductors of the RF coil systems oriented mainly parallel to the main magnetic field, i.e. for local regions at a distance from said conductors which is small relative to a main dimension of the main coil. In the case of transmitting RF coils said high local sensitivity is caused by the fact that, in positions relatively close to the conductors, the magnetic field generated by the RF coils is relatively strong. In the case of receiving RF coils said high local sensitivity is caused by the fact that, at the location of the conductors, the magnetic field generated by the nuclei in positions relatively close to the conductors is relatively strong. In particular, said high local sensitivity is present in the case of so-called surface coil systems, i.e. RF coil systems which are placed directly on the patient's body to achieve an improved signal-to-noise ratio. As a result of said high local sensitivity, known MRI systems using surface coil systems are highly susceptible to movement artefacts in the generated image, which are caused by relatively strong signals generated at the surface of the patient, for example in the subcutaneous fat layers on the patient's chest or belly.

An object of the invention is to provide radio-frequent (RF) coil systems of the kinds mentioned in the opening paragraphs and a magnetic resonance imaging (MRI) system of the kind mentioned in the opening paragraphs in which said local high sensitivity of the RF coil systems is reduced without substantially affecting the sensitivity of the RF coil systems for positions which are not relatively close to the conductors of the RF coil systems.

In order to achieve said object, an RF coil system in accordance with the invention for transmitting an RF magnetic field is characterized in that the RF coil system comprises an electrical auxiliary coil assigned to said conductor of the main coil and having at least two electrical conductors extending mainly parallel to the coil axis, said two conductors of the auxiliary coil being arranged on opposite sides of and at a distance from said conductor of the main coil, wherein said distance is small relative to a main dimension of the main coil, the RF coil system comprising means for supplying RF signals to the main coil and to the auxiliary coil at such a mutual phase difference that, in a local region adjoining the conductor of the main coil, a combined RF magnetic field of the main coil and the auxiliary coil has a direction of rotation opposite to the direction of precession.

In order to achieve said object, an RF coil system in accordance with the invention for receiving an RF magnetic field is characterized in that the RF coil system comprises an electrical auxiliary coil assigned to said conductor of the main coil and having at least two electrical conductors extending mainly parallel to the coil axis, said two conductors of the auxiliary coil being arranged on opposite sides of and at a distance from said conductor of the main coil, wherein said distance is small relative to a main dimension of the main coil, the RF coil system comprising means for combining and adding a first RF signal received by the main coil and a second RF signal received by the auxiliary coil at such a mutual phase difference that the second RF signal suppresses the first RF signal.

In order to achieve said object, an MRI system in accordance with the invention is characterized in that the RF coil system used therein is an RF coil system in accordance with the invention.

The auxiliary coil of the RF coil system in accordance with the invention for transmitting an RF magnetic field generates an RF magnetic field which is directed transversely to the RF magnetic field generated by the conductor of the main coil to which the auxiliary coil is assigned. As a result, when a suitable phase difference is present between the RF signals supplied to the main coil and the auxiliary coil, the combined RF magnetic field of said conductor of the main coil and the auxiliary coil is a rotating field with a direction of rotation opposite to the direction of precession. As a result of said opposite direction of rotation, the amount of nuclear spin resonance effects generated by the RF magnetic field is strongly reduced, so that the sensitivity of the RF coil system is reduced. Since the conductors of the auxiliary coil are at a relatively small distance from the conductor of the main coil, said reduction of the nuclear spin resonance effects and of the sensitivity predominantly occurs in a local region adjoining the conductor of the main coil, i.e. in a region for which the main coil would have a relatively high sensitivity without the use of the auxiliary coil. In positions at distances from the conductor of the main coil corresponding to the main dimension of the main coil, the RF magnetic field of the auxiliary coil is relatively small or negligible, so that in these positions the generation of nuclear spin resonance effects by the main coil and the sensitivity of the main coil are hardly affected by the auxiliary coil.

The auxiliary coil of the RF coil system in accordance with the invention for receiving an RF magnetic field receives a component of the RF magnetic field generated by the spinning nuclei which is directed transversely to a component of said RF magnetic field received by the conductor of the main coil to which the auxiliary coil is assigned. The RF magnetic field generated by the spinning nuclei is a rotating field, so that a phase difference is present between the first RF signal received by the main coil and the second RF signal received by the auxiliary coil. As a result, when the first and the second RF signals are combined and added at a suitable phase difference, the second RF signal suppresses the first RF signal, so that the sensitivity of the RF coil system is reduced. Since the conductors of the auxiliary coil are at a relatively small distance from the conductor of the main coil, the auxiliary coil is sensitive predominantly for RF magnetic fields generated in a local region adjoining the conductor of the main coil, i.e. in a region for which the main coil would have a relatively high sensitivity without the use of the auxiliary coil. As a result, the reduction of the sensitivity of the main coil is achieved predominantly for said local region. The RF magnetic field, which is generated in positions at distances from the conductor of the main coil corresponding to the main dimension of the main coil, is substantially identical at the locations of the two conductors of the auxiliary coil. As a result, the auxiliary coil is hardly sensitive for this portion of the RF magnetic field, and the sensitivity of the main coil for this portion of the RF magnetic field is hardly affected by the auxiliary coil.

A particular embodiment of an RF coil system according to the invention is characterized in that the phase difference has a value between 45° and 135°. With a phase difference in this range, a substantial reduction of the high sensitivity of the main coil for the local region adjoining the conductor of the main coil is achieved both for an RF coil system according to the invention in transmitting mode and for an RF coil system according to the invention in receiving mode.

A further embodiment of an RF coil system according to the invention is characterized in that the phase difference is 90°. With a phase difference of 90°, an optimum reduction of the high sensitivity of the main coil for the local region adjoining the conductor of the main coil is achieved.

A particular embodiment of an RF coil system according to the invention is characterized in that the main coil has a loop comprising a first and a second electrical conductor extending substantially parallel to the coil axis, the RF coil system having a first and a second auxiliary coil assigned to, respectively, said first and said second conductor of the main coil, each auxiliary coil having at least two electrical conductors extending substantially parallel to the coil axis, the two conductors of each auxiliary coil being arranged on opposite sides of and at a distance from the respective conductor of the main coil, wherein said distance is small relative to a main dimension of the main coil. In this particular embodiment, the main coil is for example a square or rectangular coil. The local high sensitivity of the main coil for local regions adjoining the first conductor is effectively reduced by means of the first auxiliary coil, while the local high sensitivity of the main coil for local regions adjoining the second conductor is effectively reduced by means of the second auxiliary coil.

A further embodiment of an RF coil system according to the invention is characterized in that the first and the second auxiliary coil are connected in series. Because the currents in the first and the second conductor of the main coil are equal but oppositely directed, the first and the second auxiliary coil can be connected in series in anti-phase mode so as to form a so-called butterfly loop. In this manner, the two auxiliary coils need only one common input or output channel, so that the RF coil system and the control thereof is simplified.

A further embodiment of an RF coil system according to the invention is characterized in that a distance B between the two conductors of each auxiliary coil is smaller than $0.25*L$, wherein L is a distance between the first and the second conductor of the main coil. In this embodiment, the distance B between the two conductors of each auxiliary coil is sufficiently small relative to a main dimension of the main coil, i.e. relative to the distance L between the first and the second conductor of the main coil, to achieve the desired local sensitivity reducing effect of the auxiliary coils.

A yet further embodiment of an RF coil system according to the invention is characterized in that the distance B is approximately $0.125*L$. In this embodiment, an optimum dimension of the local regions adjoining the two conductors of the main coil is achieved for which the high sensitivity of the main coil is reduced by the auxiliary coils.

A further embodiment of an RF coil system according to the invention is characterized in that the RF coil system comprises a skin contact surface, the two conductors of the main coil extending in an imaginary plane at a distance D from said contact surface, and the two auxiliary coils extending in an imaginary plane at a distance H from said contact surface, wherein $0<H<3*D$. In this embodiment, a distance H-D is present between the imaginary plane, in which the two auxiliary coils extend, and the imaginary plane in which the main coil extends. With the condition $0<H<3*D$, the distance between the conductors of the auxiliary coils and the conductors of the main coil is sufficiently small relative to a main dimension of the main coil to achieve the desired local sensitivity reducing effect of the auxiliary coils.

A yet further embodiment of an RF coil system according to the invention is characterized in that $D<H<1.5*D$. In this embodiment, an optimum dimension of the local regions adjoining the two conductors of the main coil is achieved for which the high sensitivity of the main coil is reduced by the auxiliary coils.

Figure 2A:
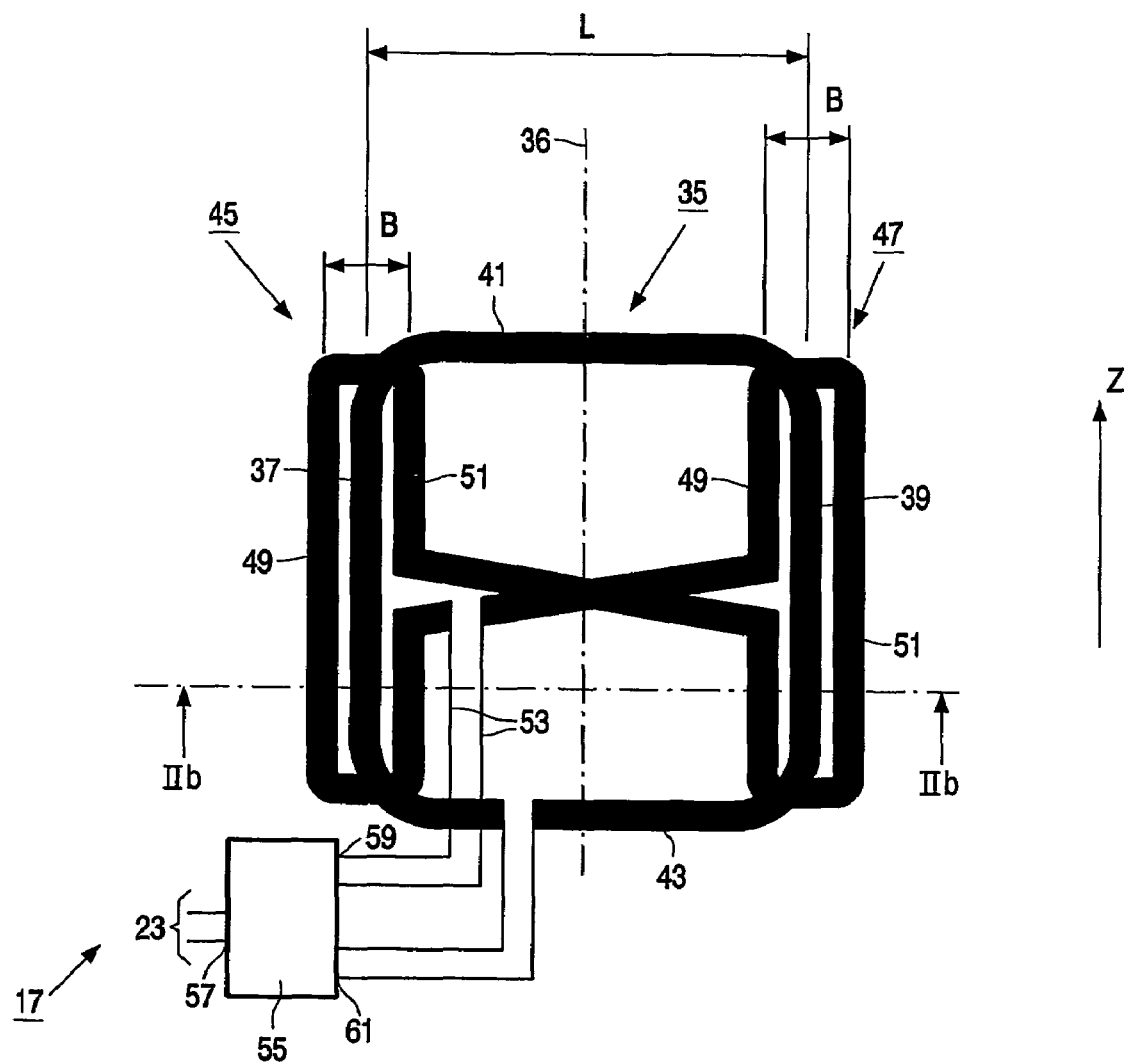
Figure 2B:
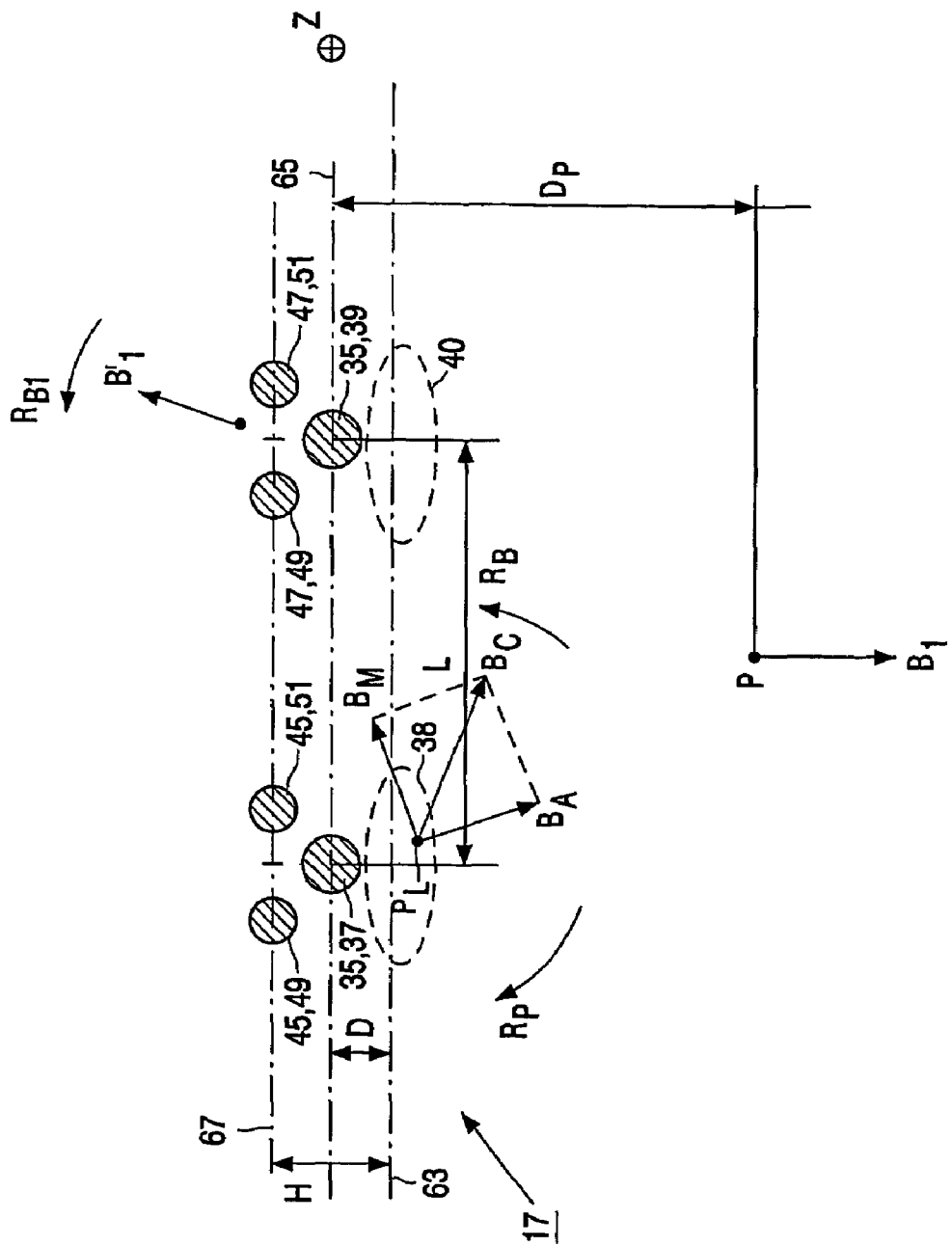

In the following, embodiments of the invention will be described in detail with reference to the figures, in which FIG. 1 diagrammatically shows a magnetic resonance imaging (MRI) system in accordance with the invention comprising a radio-frequent (RF) coil system in accordance with the invention, FIG. 2a diagrammatically shows a portion of the RF coil system of the MRI system of FIG. 1, and FIG. 2b shows a cross-section along the line IIb-IIb in FIG. 2a The MRI system in accordance with the invention shown in FIG. 1 is an MRI system of the so-called closed cylindrical type comprising a mainly cylindrical housing, which is not shown in FIG. 1 and extends in a Z-direction indicated in FIG. 1. The MRI system comprises a main magnet system 1, which is enclosed by said housing and which surrounds an examination volume 3 in which a patient to be examined can be positioned. The main magnet system 1 comprises a number of superconducting electrical coils 5 for generating a relatively strong and substantially uniform main magnetic field $B_0$ parallel to the Z-direction in a central portion of the examination volume 3. The MRI system comprises an electrical power supply 7 for the superconducting coils 5 and a cryogenic cooling device 9 with cooling channels 11 for cooling the superconducting coils 5. The MRI system further comprises a gradient magnet system 13, which is arranged between the main magnet system 1 and the examination volume 3 and comprises a number of electrical coils 15 for generating gradients of the main magnetic field $B_0$ in three orthogonal directions X, Y, and Z. The MRI system further comprises a radio-frequent (RF) coil system 17, 17' in accordance with the invention, which is arranged between the gradient magnet system 13 and the examination volume 3 for transmitting an RF magnetic field into the examination volume 3 and for receiving an RF magnetic field from the examination volume 3.

The MRI system is used to make images of the entrails of a patient's body by means of a nuclear spin resonance method. An image of the patient's body is constructed by successively observing nuclear spin resonance effects in a large number of positions in a portion of the patient's body which is present in the uniform main magnetic field $B_0$. The positions in the patient's body are successively selected by altering the gradients of the main magnetic field $B_0$ by means of suitable currents in the electrical coils of the gradient magnet system 13. For this purpose, the MRI system comprises a control unit 19, which controls the currents in the coils of the gradient magnet system 13 in accordance with a predetermined sequence, and a power amplifier 21 for amplifying the control signals supplied by the control unit 19 to the gradient magnet system 13. For each selected position in the patient's body, the RF coil system 17, 17' transmits an RF magnetic field with a predetermined frequency and pulse time into the examination volume 3 in order to generate nuclear spin resonance effects in the selected position. Subsequently, the RF coil system 17, 17' is used to receive an RF magnetic field which is generated by the spinning nuclei in the selected position in connection with the nuclear spin resonance effects. For this purpose, the control unit 19 also controls the RF coil system 17, 17' in accordance with a predetermined sequence which is linked up with the sequence according to which the gradient magnet system 13 is controlled. The control unit 19 supplies a control signal to an RF transmitting and receiving device 23, which feeds the RF coil system 17, 17' with a suitable current in order to generate the required RF magnetic field in the examination volume 3. The RF transmitting and receiving device 23 also receives a current from the RF coil system 17, 17' generated in the RF coil system 17, 17' by the RF magnetic field from the examination volume 3. The RF transmitting and receiving device 23 supplies a signal to a processor 25 of the MRI system, which is suitable for converting the signals received from the RF transmitting and receiving device 23 into an image. For this purpose, the processor 25 comprises a signal amplifier 27, a demodulator 29, an image reconstruction device 31, and a display 33.

The nuclear spin resonance effects to be generated by means of the RF coil system 17, 17' comprise a precession of the spin axes of the spinning nuclei in a predetermined direction of precession along an imaginary conical surface having a central axis parallel to the Z-direction of the main magnetic field $B_0$. Consequently, the component $B_1$ of the RF magnetic field generated by the RF coil system 17, 17', which is directed perpendicularly to the Z-direction (hereinafter called the RF magnetic field $B_1$), is predominantly effective in generating the nuclear spin resonance effects. The component $B_1$ is predominantly generated by conducting portions of the RF coil system 17, 17' which extend parallel to the Z-direction. The RF magnetic field $B_1'$, which is generated by the spinning nuclei in connection with the nuclear spin resonance effects and which is to be received by the RF coil system 17, 17', is directed perpendicularly to the Z-direction. Consequently, the conducting portions of the RF coil system 17, 17', which extend parallel to the Z-direction, are predominantly sensitive to the RF magnetic field $B_1'$. FIGS. 2a and 2b diagrammatically show a portion 17 of the RF coil system 17, 17' comprising an electrical main coil 35. The main coil 35 has a coil axis 36 which is or is to be oriented substantially parallel to the Z-direction of the main magnetic field $B_0$. The main coil 35 has a loop comprising a first electrical conductor 37 and a second electrical conductor 39, which extend substantially parallel to the coil axis 36 and accordingly form the predominantly effective and sensitive portions of the main coil 35. The loop further comprises further electrical conductors 41 and 43, which extend substantially perpendicularly to the coil axis 36 and accordingly form the portions of the main coil 35 having only a minor effectiveness and sensitivity. In the transmitting mode, an alternating electrical current in said loop results in an RF magnetic field $B_1$, as shown in FIG. 2b, in a selected position P in the patient's body at a distance $D_P$ from the loop. In the receiving mode, an RF magnetic field $B_1'$, shown in FIG. 2b and generated at the location of the loop in connection with nuclear magnetic resonance effects in said selected position P, results in an alternating electrical current induced in said loop.

In the transmitting mode, the strength of the RF magnetic field $B_1$ generated by the first and the second conductor 37, 39 in the selected position P strongly depends on the distance between the selected position P and the conductors 37, 39. In local regions 38, 40 in the patient's body adjoining the conductors 37 and 39 at a distance from the conductors 37 and 39 which is small relative to a main dimension of the main coil 35, e.g. the distance L present between the two conductors 37, 39, the generated RF magnetic field $B_1$ is relatively strong, so that the main coil 35 has a local high effectiveness for said local regions 38, 40. Similarly, in the receiving mode, a relatively strong current is induced in the first and the second conductor 37, 39 under the influence of an RF magnetic field $B_1'$ generated in connection with nuclear magnetic resonance effects in positions which are within said local regions 38, 40 adjoining the conductors 37 and 39. As a result, in the receiving mode, the main coil 35 has a local high sensitivity for said local regions 38, 40. In particular, said local high sensitivity becomes manifest in embodiments wherein the RF coil system 17, 17' is used as a so-called surface coil. In such embodiments, the RF coil system 17, 17' is placed directly on the patient's body to achieve an improved effectiveness and sensitivity and an improved signal-to-noise ratio for regions deep in the patient's body. However, it appeared that in such embodiments the local high sensitivity for the local regions 38, 40 adjoining the conductors 37, 39 causes the generated images to be highly susceptible to movement artefacts, which are caused by relatively high signals generated at the surface of the patient's body, for example in the subcutaneous fat layers on the patient's chest or belly.

In order to reduce the above described local high sensitivity of the main coil 35 for the local regions 38, 40 adjoining the first and the second conductor 37, 39 without affecting the effectiveness and the sensitivity of the main coil 35 for selected positions outside said local regions 38, 40, i.e. for positions at a distance from said conductors 37, 39 in the order of the main dimension of the main coil 35, the portion 17 of the RF coil system 17, 17' in accordance with the invention comprises a first electrical auxiliary coil 45 assigned to and associated with the first conductor 37 of the main coil 35 and a second electrical auxiliary coil 47 assigned to and associated with the second conductor 39 of the main coil 35. Each auxiliary coil 45, 47 has two electrical conductors 49, 51, which extend parallel to the coil axis 36 over substantially the complete length of, respectively, the first and the second conductor 37, 39. The two conductors 49, 51 of each auxiliary coil 45, 47 are arranged on opposite sides of the respective conductor 37, 39 of the main coil 35 and at a distance from said respective conductor 37, 39 which is small relative to a main dimension of the main coil 35, for example the distance L between the first and the second conductor 37, 39. In the embodiment shown in FIGS. 2a and 2b, the first and the second auxiliary coil 45, 47 are connected in series, the two auxiliary coils 45, 47 having only a single common input and output channel 53. In this embodiment it is necessary that the two auxiliary coils 45, 47 are mutually connected in anti-phase mode so as to form a so-called butterfly loop as shown in FIG. 2a, so that the currents in the two auxiliary coils 45, 47 have mutually opposite directions.

FIG. 2b shows an RF magnetic field $B_M$ and an RF magnetic field $B_A$ which are generated in the transmitting mode by, respectively, the first conductor 37 of the main coil 35 and the first auxiliary coil 45 in a position $P_L$ within the local region 38 adjoining the first conductor 37. As a result of the orientation of the first auxiliary coil 45 relative to the first conductor 37 as described before, the RF magnetic field $B_A$ generated by the first auxiliary coil 45 is directed transversely to the RF magnetic field $B_M$ generated by the first conductor 37. As shown in FIG. 2a, the RF coil system 17, 17' comprises a signal combining and splitting device 55, which has a first electrical connection 57 with the RF transmitting and receiving device 23, a second electrical connection 59 with the common input and output channel 53 of the first and second auxiliary coils 45, 47, and a third electrical connection 61 with the main coil 35. In the transmitting mode, the signal combining and splitting device 55 splits the RF signal supplied by the RF transmitting and receiving device 23 into a corresponding first RF signal to be supplied to the main coil 35 and a corresponding second RF signal to be supplied to the first and second auxiliary coils 45, 47, wherein a predetermined phase difference is present between said first and second RF signals. As a result of said phase difference, a combined RF magnetic field $B_C$ of the first conductor 37 of the main coil 35 and the first auxiliary coil 45, shown in FIG. 2b, is a rotating RF magnetic field. Said phase difference is such that said combined RF magnetic field $B_C$ has a direction of rotation $R_B$ opposite to the direction of precession $R_P$ of the spin axes of the spinning nuclei. In FIG. 2b, which represents a view in the Z-direction of the main magnetic field $B_0$, the direction of precession $R_P$ is shown as a clockwise direction and the direction of rotation $R_B$ is shown as an anti-clockwise direction. Since the direction of rotation $R_B$ of the combined RF magnetic field $B_C$ is opposite to the direction of precession $R_P$, the amount of nuclear spin resonance effects effected by the combined RF magnetic field Bc in the local region 38 is strongly reduced, so that the efficiency of the RF coil system 17, 17' for said local region 38 is strongly reduced. For the local region 40 adjoining the second conductor 39 of the main coil 35, a similar reduction of the efficiency of the RF coil system 17, 17' is obtained as a result of the direction of rotation of combined RF magnetic field of said second conductor 39 and the second auxiliary coil 47. In positions at a distance from the first and second conductors 37, 39 in the order of magnitude of the main dimension of the main coil 35, like in the position P shown in FIG. 2b, the RF magnetic field generated by the first and second auxiliary coils 45, 47 is relatively small or even negligible, because the distance between the first and second conductors 49, 51 of each auxiliary coil 45, 47 is small relative to the distance between said position P and each of the auxiliary coils 45, 47. As a result, the efficiency of the main coil 35 in effecting nuclear spin resonance effects in such positions is hardly affected by the auxiliary coils 45, 47.

FIG. 2b further shows an RF magnetic field $B_1'$ generated near the second conductor 39 of the main coil 35 in connection with nuclear spin resonance effects in the local region 40 adjoining the second conductor 39. The RP magnetic field $B_1'$ is a rotating RF magnetic field having a direction of rotation $P_{B1}$ which is opposite to the direction of precession $R_P$. As a result of the orientation of the second auxiliary coil 47 relative to the second conductor 39 of the main coil 35 as described before, the second auxiliary coil 47 predominantly receives a component of the rotating RF magnetic field $B_1'$ which is directed transversely to a component of said field $B_1'$ which is predominantly received by the second conductor 39. As a result, a phase difference is present between a first RF signal generated in the second conductor 39 by the rotating field $B_1'$ and a second RF signal generated in the second auxiliary coil 47 by the rotating field $B_1'$. In the receiving mode of the RF coil system 17, 17', the signal combining and splitting device 55 combines said first and second RF signals at a predetermined phase difference, i.e. the signal combining and splitting device 55 shifts the second RF signal relative to the first RF signal over said predetermined phase difference and subsequently adds the shifted second RF signal and the first RF signal. Said phase difference is such that the shifted second RF signal suppresses the first RF signal. In this manner, the sensitivity of the main coil 35 for the RF magnetic field $B_1'$ generated in the local region 40 adjoining the second conductor 39 of the main coil 35 is reduced. For the local region 38 adjoining the first conductor 37 of the main coil 35, a similar reduction of the sensitivity of the RF coil system 17, 17' is obtained as a result of the fact that the signal combining and splitting device 55 combines and adds the first RF signal received by the main coil 35 and the second RF signal received by the auxiliary coils 45, 47 at said phase difference. The sensitivity of the auxiliary coils 45, 47 for RF magnetic fields, which are generated in connection with nuclear spin resonance effects in positions at a distance from the first and second conductors 37, 39 in the order of magnitude of the main dimension of the main coil 35, like in the position P shown in FIG. 2b, is relatively small or even negligible, because the distance between the first and second conductors 49, 51 of each auxiliary coil 45, 47 is small relative to the distance between said position P and each of the auxiliary coils 45, 47. As a result, the sensitivity of the main coil 35 for the RF magnetic fields generated in such positions is hardly affected by the auxiliary coils 45, 47.

It was found that, both in the transmitting mode and in the receiving mode of the RF coil system 17, 17', a substantial reduction of the local high efficiency and sensitivity of the main coil 35 for the local regions 38, 40 adjoining the first and second conductors 37, 39 is achieved if said phase difference has a value between 45° and 135°. Within said range of phase differences an optimum reduction of said local high efficiency and sensitivity is achieved if said phase difference is approximately 90°. It is noted that the foregoing description does only intend to give an absolute value for the phase difference, but does not intend to indicate whether the phase difference has a positive or a negative value. In the foregoing description, the fact whether the phase difference has a positive or a negative value is only disclosed by means of the result to be achieved, i.e. in the transmitting mode the phase difference results in the combined RF magnetic field $R_C$ having a direction of rotation $R_B$ opposite to the direction of precession $R_P$, and in the receiving mode the phase difference results in the second RF signal received by the auxiliary coils 45, 47 suppressing the first RF signal received by the main coil 35. The person skilled in the art will be able to determine whether the phase difference must have a positive or a negative value on the basis of the configuration of the main coil 35, the auxiliary coils 45, 47, and the orientation of the electrical connections between the RF transmitting and receiving device 23 and the main coil 35 and auxiliary coils 45, 47.

In the foregoing it is disclosed that, in order to obtain a reduction of the sensitivity of the main coil 35 which is limited to the local regions 38, 40 in the patient's body adjoining the first and second conductors 37, 39 of the main coil 35, the two conductors 49, 51 of each auxiliary coil 45, 47 should be arranged on opposite sides of the respective conductor 37, 39 of the main coil 35 and at a distance from said respective conductor 37, 39 which is small relative to a main dimension of the main coil 35, for example the distance L between the first and the second conductor 37, 39. In the embodiment shown in FIGS. 2a and 2b, the two conductors 49, 51 of each auxiliary coil 45, 47 are at equal distances from the respective conductor 37, 39 of the main coil 35. It is however noted, that the invention also comprises embodiments in which the two conductors 49, 51 of each auxiliary coil 45, 47 are at opposite sides of but at unequal distances from the respective conductor 37, 39. It is further noted that, in this respect, the expression "on opposite sides of" intends to indicate that the two conductors 49, 51 of each auxiliary coil 45, 47 must be arranged on opposite sides of an imaginary plane which extends through the respective conductor 37, 39 of the main coil 35 and is oriented perpendicularly to the imaginary plane in which the main coil 35 extends.

In the following, concrete form is given to the essential feature that the two conductors 49, 51 of each auxiliary coil 45, 47 must be arranged at a distance from the respective conductor 37, 39 of the main coil 35 which is small relative to a main dimension of the main coil 35, for example the distance L between the first and the second conductor 37, 39. It was found that, in the embodiment shown in FIGS. 2a and 2b, a sufficient sensitivity reducing effect of the auxiliary coils 45, 47 is obtained if a distance B between the two conductors 49, 51 of each auxiliary coil 45, 47, shown in FIG. 2a, is smaller than 0.25*L, wherein L is the distance between the first and the second conductor 37, 39 of the main coil 35 as shown in FIG. 2a. An optimum dimension of the local regions 38, 40, for which a desired sensitivity reducing effect is achieved, is obtained if the distance B is approximately 0.125*L. In an embodiment wherein the RF coil system 17, 17' is used as a surface coil, an optimum range can also be defined for the distance between the auxiliary coils 45, 47 and a skin contact surface of the RF coil system 17, 17'. FIG. 2b schematically shows the position of a skin contact surface 63 of the RF coil system 17, 17', i.e. a surface via which the RF coil system 17, 17' is in contact with the patient's skin during operation. As shown in FIG. 2b, a distance D is present between the skin contact surface 63 and an imaginary plane 65 in which the first and second conductors 37, 39 of the main coil 35 extend, and a distance H is present between the skin contact surface 63 and an imaginary plane 67 in which the two auxiliary coils 45, 47 extend. It was found that, if the distance H is within the range between 0 and 3*D, the distance between the conductors 49, 51 of the auxiliary coils 45, 47 and the conductors 37, 39 of the main coil 35 is sufficiently small to achieve a sufficient sensitivity reducing effect of the auxiliary coils 45, 47. Preferably, the distance H is larger than the distance D, i.e. the auxiliary coils 45, 47 are arranged at a side of the main coil 35 which is remote from the skin contact surface 63. An optimum dimension of the local regions 38, 40, for which a desired sensitivity reducing effect is achieved, is obtained if the distance H is between D and 1.5*D.

The MRI system in accordance with the invention described before is an MRI system of the so-called closed cylindrical type. It is noted that the invention also encloses other types of MRI systems. An example is an MRI system of the so-called open type, in which the main magnet system and the gradient magnet system have been arranged in two separate housing portions at a distance from each other and in which the examination volume is an open volume present between said two housing portions.

The RF coil system 17, 17' in accordance with the invention described before has both a transmitting and a receiving function. It is noted that the invention also encloses RF coil systems which only have a receiving function and RF coil systems which only have a transmitting function. In particular, RF coil systems in accordance with the invention, which are used as a surface coil, may only have a receiving function so as to co-operate with a further RF coil system, which is in a fixed position relative to the main magnet system of the MRI system and which has only a transmitting function or a combined transmitting and receiving function.

It is noted that the invention also encloses RF coil systems which have a coil configuration which is different from the coil configuration of the RF coil system 17, 17' shown in FIGS. 2a and 2b. For example, the invention also encloses RF coil systems having more than one main coil. Particularly, an RF coil system in accordance with the invention may be provided with a number of main coils which are arranged in mutually transversely oriented planes so as to improve the efficiency of generating and/or the sensitivity of receiving a rotating RF magnetic field in the examination volume. In such an embodiment, the conductors of each main coil oriented parallel to the $B_0$ field may be provided with a separate auxiliary coil. It is further noted that in embodiments, in which more than one auxiliary coil are used, all auxiliary coils or a number of auxiliary coils may be connected in series, like in the embodiment shown in FIGS. 2a and 2b, but each of the auxiliary coils may also have its own input and/or output channel. It is finally noted that, in order to be effective, an RF coil system in accordance with the invention should be provided with at least one conductor which is or is to be oriented mainly parallel to the $B_0$ field. However, such a conductor does not need to be a straight conductor extending parallel to the $B_0$ field, like the conductors 37, 39 in the embodiments shown in FIGS. 2a and 2b. The conductor may, for example, also be a curved conductor having a main or predominant orientation parallel to the $B_0$ field. Accordingly, the expressions "said main coil having at least one electrical conductor extending mainly parallel to the coil axis" in the claims are to be interpreted in accordance herewith. Accordingly, also the expressions "an electrical auxiliary coil assigned to said conductor of the main coil and having at least two electrical conductors extending mainly parallel to the coil axis" in the claims are to be interpreted in the same manner.

The invention claimed is:

1. A radio-frequent (RF) coil system for use in a magnetic resonance imaging (MRI) system, comprising at least one electrical main coil for transmitting an RF magnetic field into an examination volume of the MRI system for generating nuclear spin resonance effects with a predetermined direction of precession, said main coil having a coil axis which is to be oriented substantially parallel to a main magnetic field of the MRI system in the examination volume, said main coil having at least one electrical conductor extending mainly parallel to the coil axis, wherein the RF coil system comprises an electrical auxiliary coil assigned to said conductor of the main coil and having at least two electrical conductors extending mainly parallel to the coil axis, said two conductors of the auxiliary coil being arranged on opposite sides of and at a distance from said conductor of the main coil, wherein said distance is small relative to a main dimension of the main coil, the RF coil system comprising means for supplying RF signals to the main coil and to the auxiliary coil at such a mutual phase difference that, in a local region adjoining the conductor of the main coil, a combined RF magnetic field of the main coil and the auxiliary coil has a direction of rotation opposite to the direction of precession and wherein the main coil has a loop comprising a first and a second electrical conductor extending substantially parallel to the coil axis, the RF coil system having a first and a second auxiliary coil assigned to, respectively, said first and said second conductor of the main coil, each auxiliary coil having at least two electrical conductors extending substantially parallel to the coil axis, the two conductors of each auxiliary coil being arranged on opposite sides of and at a distance from the respective conductor of the main coil, wherein said distance is small relative to a main dimension of the main coil and wherein a distance B between the two conductors of each auxiliary coil is smaller than 0.25*L, wherein L is a distance between the first and the second conductor of the main coil.

2. An RF coil system as claimed in claim 1, wherein the phase difference has a value between 450° and 1350°.

3. An RF coil system as claimed in claim 2, wherein the phase difference is 90°.

4. An RF coil system as claimed in claim 1, wherein the first and the second auxiliary coil are connected in series.

5. An RF coil system as claimed in claim 1, wherein the distance B is approximately 0.125*L.

6. A magnetic resonance imaging (MRI) system comprising an examination volume, a main magnet system for generating a main magnetic field in the examination volume, a gradient magnet system for generating gradients of the main magnetic field, and an RF coil system for transmitting and/or receiving an RF magnetic field in the examination volume, wherein the RF coil system is an RF coil system as claimed in claim 1.

7. A radio-frequent (RF) coil system for use in a magnetic resonance imaging (MRI) system, comprising at least one electrical main coil for receiving an RF magnetic field in an examination volume of the MRI system generated as a result of nuclear spin resonance effects, said main coil having a coil axis which is to be oriented substantially parallel to a main magnetic field of the MRI system in the examination volume, said main coil having at least one electrical conductor extending mainly parallel to the coil axis, wherein the RF coil system comprises an electrical auxiliary coil assigned to said conductor of the main coil and having at least two electrical conductors extending mainly parallel to the coil axis, said two conductors of the auxiliary coil being arranged on opposite sides of and at a distance from said conductor of the main coil, wherein said distance is small relative to a main dimension of the main coil, the RF coil system comprising means for combining and adding a first RF signal received by the main coil and a second RF signal received by the auxiliary coil at such a mutual phase difference that the second RF signal suppresses the first RF signal and wherein the main coil has a loop comprising a first and a second electrical conductor extending substantially parallel to the coil axis, the RF coil system having a first and a second auxiliary coil assigned to, respectively, said first and said second conductor of the main coil, each auxiliary coil having at least two electrical conductors extending substantially parallel to the coil axis, the two conductors of each auxiliary coil being arranged on opposite sides of and at a distance from the respective conductor of the main coil, wherein said distance is small relative to a main dimension of the main coil and wherein a distance B between the two conductors of each auxiliary coil is smaller than 0.25*L, wherein L is a distance between the first and the second conductor of the main coil.

8. A radio-frequent (RF) coil system for use in a magnetic resonance imaging (MRI) system, comprising at least one electrical main coil for transmitting an RF magnetic field into an examination volume of the MRI system for generating nuclear spin resonance effects with a predetermined direction of precession, said main coil having a coil axis which is to be oriented substantially parallel to a main magnetic field of the MRI system in the examination volume, said main coil having at least one electrical conductor extending mainly parallel to the coil axis, wherein the RF coil system comprises an electrical auxiliary coil assigned to said conductor of the main coil and having at least two electrical conductors extending mainly parallel to the coil axis, said two conductors of the auxiliary coil being arranged on opposite sides of and at a distance from said conductor of the main coil, wherein said distance is small relative to a main dimension of the main coil, the RF coil system comprising means for supplying RF signals to the main coil and to the auxiliary coil at such a mutual phase difference that, in a local region adjoining the conductor of the main coil, a combined RF magnetic field of the main coil and the auxiliary coil has a direction of rotation opposite to the direction of precession and wherein the main coil has a loop comprising a first and a second electrical conductor extending substantially parallel to the coil axis, the RF coil system having a first and a second auxiliary coil assigned to, respectively, said first and said second conductor of the main coil, each auxiliary coil having at least two electrical conductors extending substantially parallel to the coil axis. the two conductors of each auxiliary coil being on opposite sides of and at a distance from the respective conductor of the main coil, wherein said distance is small relative to a main dimension of the main coil and wherein the RF coil system comprises a skin contact surface, the two conductors of the main coil extending in an imaginary plane at a distance D from said contact surface, and the two auxiliary coils extending in an imaginary plane at a distance H from said contact surface, wherein $0<H<3*D$.

9. An RF coil system as claimed in claim 8, wherein $D<H<1.5*D$.

* * * * *